United States Patent
Deutscher et al.

(10) Patent No.: US 9,349,935 B2
(45) Date of Patent: *May 24, 2016

(54) HIGH TEMPERATURE SUPERCONDUCTIVE FILMS AND METHODS OF MAKING THEM

(71) Applicant: TECHNOLOGY INNOVATION MOMENTUM FUND (ISRAEL) LIMITED PARTNERSHIP, Tel Aviv (IL)

(72) Inventors: Guy Deutscher, Herzliya (IL); Mishael Azoulay, Kfar-Saba (IL); Boaz Almog, Rehovot (IL)

(73) Assignee: TECHNOLOGY INNOVATION MOMENTUM FUND (ISRAEL) LIMITED PARTNERSHIP, Tel Aviv (IL)

( * ) Notice: Subject to any disclaimer, the term of this patent is extended or adjusted under 35 U.S.C. 154(b) by 0 days.

This patent is subject to a terminal disclaimer.

(21) Appl. No.: 14/177,589

(22) Filed: Feb. 11, 2014

(65) Prior Publication Data

US 2014/0162884 A1    Jun. 12, 2014

Related U.S. Application Data

(63) Continuation-in-part of application No. 12/687,139, filed on Jan. 14, 2010, now Pat. No. 8,664,163.

(60) Provisional application No. 61/144,784, filed on Jan. 15, 2009.

(51) Int. Cl.
*H01L 39/00* (2006.01)
*H01B 12/00* (2006.01)
*H01L 39/24* (2006.01)
(Continued)

(52) U.S. Cl.
CPC ............ *H01L 39/24* (2013.01); *H01L 39/2435* (2013.01); *H01L 39/2461* (2013.01); *H01Q 9/27* (2013.01); *H01L 39/143* (2013.01); *H01L 39/16* (2013.01); *Y10T 428/2495* (2015.01); *Y10T 428/24975* (2015.01)

(58) Field of Classification Search
None
See application file for complete search history.

(56) References Cited

U.S. PATENT DOCUMENTS 5,739,086 A * 4/1998 Goyal et al. .................. 505/473
5,741,377 A * 4/1998 Goyal et al. .................. 148/512
(Continued)

OTHER PUBLICATIONS

Krupke et al. "A Systematic Approach to Reduce Macroscopic Defects in C-Axis-oriented YBCO Films" Physica C, 1999, pp. 536-539.*

(Continued)

*Primary Examiner* — Colleen Dunn
(74) *Attorney, Agent, or Firm* — Browdy and Neimark, PLLC

(57) ABSTRACT

Described is a superconductive layered structure and an article including this superconductive layered structure on a substrate structure. The superconductive layered structure comprises a stack including at least one bi-layered assembly formed by first and second layers of similar superconducting material compositions, the second layer being superconductive at predetermined temperature condition, the first layer being a substantially thin layer and having a c lattice parameter selected in accordance with those of the substrate structure and the second layer, such that said first layer is non-superconductive at said predetermined temperature condition thereby allowing the second superconductive layer to be desirably thick to provide high critical current density of the superconductive layer.

32 Claims, 10 Drawing Sheets

(51) Int. Cl.
*H01Q 9/27* (2006.01)
*H01L 39/14* (2006.01)
*H01L 39/16* (2006.01)

(56) References Cited

U.S. PATENT DOCUMENTS

| | | | | |
|---|---|---|---|---|
| 5,898,020 | A * | 4/1999 | Goyal et al. | 505/239 |
| 5,958,599 | A * | 9/1999 | Goyal et al. | 428/457 |
| 7,208,196 | B2 | 4/2007 | Sambasivan et al. | |
| 8,227,082 | B2 | 7/2012 | Goyal | |
| 8,481,460 | B2 | 7/2013 | Goyal | |
| 2004/0096707 | A1 * | 5/2004 | Sambasivan et al. | 428/698 |
| 2007/0042127 | A1 * | 2/2007 | Hammond et al. | 427/457 |
| 2009/0081456 | A1 | 3/2009 | Goyal | |
| 2009/0082211 | A1 | 3/2009 | Nakayama et al. | |

OTHER PUBLICATIONS

Wordenweber et al. "Large-area YBCO films on Sapphire for Microwave APplications". IEEE Transactions on Applied Superconductivity; Jun. 1999, pp. 1486-24+1; vol. 9 No. 2.*

Klein et al.; "The Effective Microwave Surface Impedance of high-Tc Thin Films"; Journal of Applied Physics; Jun. 1, 1990; pp. 6940-6945; vol. 67; American Institute of Physics, USA.

Kastner et al.; "Microcracks Observed in Epitaxial Thin Films of . . . ", Phys. Stat. Sol;1995; pp. 381-394; vol. 150.

Zaitsev et al.; "Abstract of Critical Thickness of YBCO films in CeO2 Buffered Sapphire"; Applied Superconductivity; 1997; pp. 25-28; vol. 158.

Zaitsev et al.; "Large Area YBaCu3O7 Films on Sapphire with Excellent Microwave Power Handling Capability"; Journal of Superconductivity; 1998;pp. 361-365; vol. 11, No. 3.

Wordenweber, R.; "Growth of high-Tc Thin Films"; Superconductor Science and Technology; 1999; pp. R86-R102; vol. 12.

Zuccaro et al.; "Nonlinear Microwave Losses of Large Area YBCO thin films"; Inst. Phys. Conf.; 1997; pp. 295-298.

Wordenweber et al., "Large-area YBCO Films on Sapphire for Microwave Applications"; IEEE Transactions on Applied Superconductivity; Jun. 1999; pp. 2486-2491; vol. 9, No. 2.

Develos-Bagarinao et al.; "Multi-layered Structures of (RE = rare earth) Ba2Cu3Ox films: an Approach for the Growth of Superior Quality Large-Area Superconducting Films on Sapphire Substrates"; Superconductor Science and Technology; 2007; pp. L25-L29; 20.

Develos-Bagarinao et al.; "Thickness Dependence of Jc for YBCO thin films Prepared by Large-area Pulsed Laser Deposition on CeO2-Buffered Sapphire Substrates"; Superconductor Science and Technology; 2005; pp. 667-674; vol. 18.

Drozdov et al.; "Microstructures and Electrical Properties of YBCO Films"; Superconductor Science and Technology; 1996; pp. A166-A169; vol. 9.

Rao et al.; "Microstructural Study of Yttria Stabilized Zirconia Buffered Sapphire for YBaCu3O7 Thin Films"; Journal of Applied Physics; Jan. 15, 1996; pp. 940-946; vol. 79.

Krupke et al.; "A Systematic Approach to Reduce Macroscopic Defects in c-axis-oriented YBCO Films"; Physica C; 1999; pp. 536-539.

Almog et al.; "Characterization of Large Size YBa2Cu3O7 Films Using Magnetic Field Penetration"; Superconductor Science and Technology; 2005; pp. 1441-1444; vol. 18.

Almog et al.; Homogenous Crack-free Large Size YBCO/YSZ/Sapphire Films for Application; 24th International Conference on Low Temperature Physics; 2006; pp. 471-472.

Goyal et al.; "Epitaxial Growth of Superconductors of SSIFFS"; Presented at the High Temperature Superconductivity Program Peer Review of the US DOE; Jul. 30, 2008; Available at http://www.htspeerreview.com/2008/pdfs/presentations/wednesday/research/1%20SR%20Strategic%20Substrate%20Development%20for-%20Coated%20 Conductors.pdf.

* cited by examiner

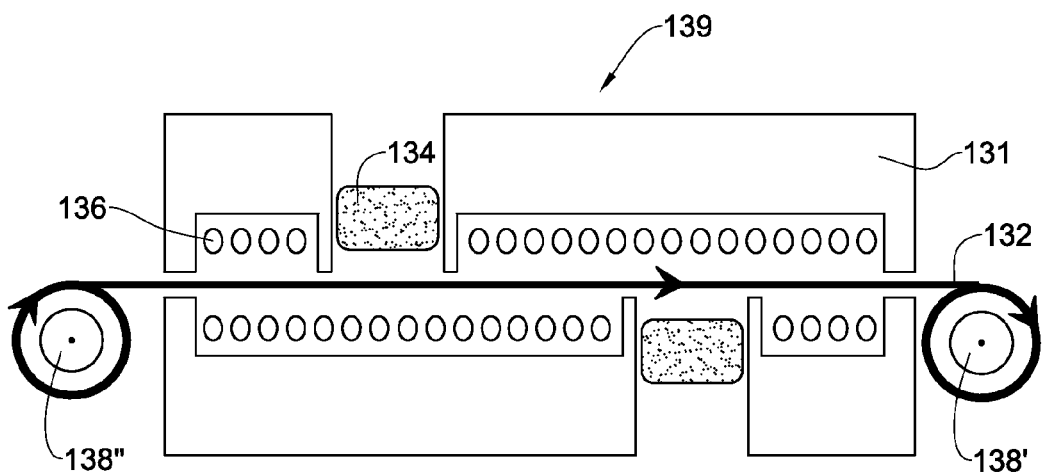
FIG. 13B
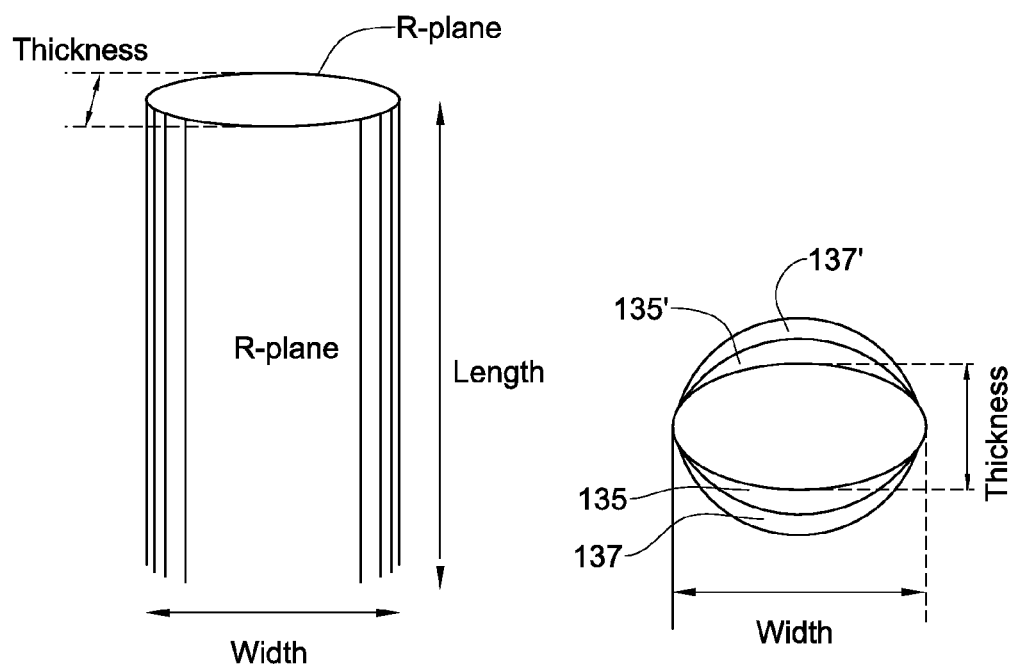
FIG. 13C
FIG. 13D

_

HIGH TEMPERATURE SUPERCONDUCTIVE FILMS AND METHODS OF MAKING THEM

RELATED APPLICATIONS

This is a Continuation-in-Part of U.S. application Ser. No. 12/687,139 filed Jan. 14, 2010, which claims the benefit of U.S. Provisional Application No. 61/144,784 filed Jan. 15, 2009. The disclosures of each of these prior art applications are hereby incorporated by reference herein in their entirety.

FIELD OF THE INVENTION

This invention relates to temperature superconductive films and method of fabrication of such films.

BACKGROUND OF THE INVENTION

The current inventors reported, in the 24$^{th}$ International Conference on Low Temperature Physics—LT24 Conference Proceedings 850, 471 (2006), the growth of high quality, large size, crack free films of YBCO ($YBa_2Cu_3O_{7-x}$) on top of r-cut Sapphire with a buffer layer of YSZ (Yttrium-stabilized $ZrO_2$).

According to this report, both YSZ and YBCO layers were grown by off axis dc magnetron sputtering from stoichiometric single targets. The YSZ layer was sputtered at 5 mTorr of Ar with the substrate at 955° C. The thickness of the YSZ was 100 nm, deposited at a deposition rate of 0.01 nm/sec. During the sputtering of YBCO the heater temperature was 930° C. The substrate was heated by IR radiation and its temperature was estimated as 750° C. The gas mixture was 50/50 percent oxygen and argon at 200 mTorr. The dc power on the target was 140 W, yielding a sputtering rate of about 0.03 nm/sec. An annealing process in pure oxygen was performed for 16 hours at approximately 500° C.

The thickest layer reported was about 1000 nm thick, and had critical current density of about 0.2 $MA/cm^2$ (See FIG. 3 of the report), which at the given thickness is equivalent to critical current of 20 A per cm width.

Other publications that may serve for understanding the background of the invention include:
1. N. Klein et al., *J. Appl. Phys.* 67, 6940 (1990).
2. G. Kästner et al., *Phys. Stat. Sol.* (a) 150, 381 (1995).
3. A. G. Zaitsev et al., *Applied Superconductivity: Inst. Phys. Conf Ser.* 158, 25 (1997).
4. A. G. Zaitsev et al. *J. Supercond.* 11, 361 (1998).
5. R. Wördenweber, *Supercond. Sci. Technol.* 12, 86 (1999).
6. C. Zuccaro et al., *IEEE Trans. Appl. Supercond.* 1, 295 (1997).
7. R. Wordenweber et al., *IEEE Transactions on Applied Superconductivity* 9, 2486 (1999).
8. K. Develos-Baraginao et al., *Supercond. Sci. and Tech.* 20, L25 (2007).
9. K. Develos-Baraginao et al., *Supercond. Sci. and Tech.* 18, 667 (2005).
10. Yu N. Drozdov et al., *Supercond. Sci. Tech.* 9, A166 (1996).
11. M. S. Rao et al., *J. Appl. Phys.* 79, 940 (1996).
12. R. Krupke et al., *Physica C* 317-318, 536 (1999).
13. B. Almog et al., *Supercond. Sci. Technol.* 18 (2005) 1441-1444
14. "Epitaxial Growth of Supercondcutors of SSIFFS" by Goal et al., presented at High Temperature Superconductivity program Peer Review of the USA Department of Energy on Jul. 30, 2008, available on the Internet at http://www.energetics.com/supercom/08/pdfs/presentations/wednesday/research/1%20SR%20Strategic%20Substrate%20Development%20for-%20Coated%20Conductors.pdf

GENERAL DESCRIPTION

The present invention provides a novel superconducting article/structure utilizing one or more high temperature superconductive films. The technique of the invention is aimed at enabling a relatively thick superconductive layer/film, to thereby provide high critical current density of the superconductive layer. Also, the technique of the present invention provides for forming (growing) a superconducting structure on any substrate structure, and advantageously provides for using substantially planar substrates, as well as forming the superconducting structure on opposite surfaces of the substrate structure (two-side coating).

According to the invention, the above goal is achieved by using first and second YBCO layers on a substrate structure (e.g. including an r-cut sapphire substrate), where the first YBCO layer serves as a template for the second YBCO layer allowing the second YBCO layer to be desirably thick. The first, template, YBCO layer is relatively thin (e.g. up to 50 nm thickness), and has a predetermined c lattice parameter selected to be non-superconductive at temperatures above a predetermined temperature. This enables growth thereon of the second relatively thick (e.g. more than 100 nm thickness) superconductive YBCO layer having a certain lower c lattice parameter at the temperatures above said predetermined temperature.

The substrate structure includes a substrate of selected material composition, e.g. sapphire or silicone, which is typically formed with a buffer YSZ layer. The buffer layer is located on at least that surface of the substrate where the superconductive structure is to be formed.

In some preferred embodiments, the second YBCO layer is superconductive at temperatures above at least 77K. Optionally, the layer is superconductive at temperatures up to 90K.

In the context of the present description and claims, a layer is considered superconductive if electric currents of up to 1 $A/cm^2$ flow through the layer without any potential difference, or if higher currents are associated with potential difference of 1 µV/cm or less. The smallest current, at which a greater potential difference is developed is referred to as critical current, above which the layer is not superconductive.

The layer has two large dimensions (hereinafter length and width), and one small dimension, referred to as thickness. A layer is considered thick if its thickness is more than 100 nm, e.g. 600 nm, 800 nm, 950 nm, 1000 nm, 1200 nm, or intermediate or larger thickness. A layer is considered very thin if its thickness is 50 nm or smaller. Critical current of a very thin superconductive layer is above 10 A per cm width.

In some preferred embodiments, the surface area of the superconductive layer is 10 $cm^2$ or more, for instance, 10, 25, 50, 75, 100 $cm^2$, or intermediate or larger surface areas.

In some preferred embodiments, the layer thickness is larger than 100 nm and the critical current is at least 100 A per cm width, for example, 200 A per cm width. Thus, there is provided in accordance with an exemplary embodiment of the invention a superconductive layer having a surface area of at least 10 $cm^2$, thickness of at least 600 nm, and critical current of at least 100 A/cm width at a temperature of 77K or higher.

As described above, the superconductive layered structure is grown on a substrate structure. Generally, the technique of the present invention, i.e. provision of a relatively thick, high critical current density, superconductive layer/film on top of a relatively thin non-superconductive template layer carried by a substrate structure, is not limited to the use of any specific substrate of any specific material composition and geometry. In some embodiments, the substrate comprises an r-cut single crystal of sapphire. Optionally, the substrate is an r-cut sapphire wire, as described in Ref. 14. Optionally, the Yttrium Stabilized Zirconium (YSZ) is grown on an r-plane defined by one of the following Miller-Bravais indices: [1 –1 0 2] or [1 0 1 2]. In some exemplary embodiments of the invention, the layer is attached to a 500 µm thick sapphire single crystal. Other examples of substrate thickness include 250 µm and 750 µm. Thicker substrates are more robust, and thinner substrates are more flexible and less fragile.

Thus, although in the description below, the substrate is exemplified as an r-cut single crystal of sapphire, the invention should not be limited to this specific example. The inventors, however, have found some attractive advantages of using sapphire as a single crystal substrate in the form of a tape for the growth of High-$T_c$ YBCO films. One of these advantages relates to applications where a so-called "double coating" or "two-side coating" of the superconductive film is required. This is hard or practically impossible to achieve in current state of the art coated conductors grown on polycrystalline metallic substrates through a number of intermediate buffer layers, grown on one side only.

Two side coating provides for lower cost and lower thermal conductance, because two side coating multiplies by a factor of 2 the maximum supercurrent that can be passed through the given coated tape, thereby reducing by a factor of 2 the cost of the substrate (as less substrate material is used) and the thermal conductance of the tape. The latter is of great advantage in current leads used to feed high currents into large scale coils operated at liquid helium such as used in MRI machines and particle accelerators, these leads having ideally zero electrical resistance and infinite thermal resistance to avoid heat input into the liquid Helium bath.

Also, two side coating provides for AC losses reduction, because the return current can be flown on the back side, thereby reducing drastically the large edge magnetic fields responsible for the large AC losses in the conventional coated conductors. Reduction of AC losses is important for most applications of superconducting tapes such as FCL, Cables and Transformers. These losses generate heat which greatly increases the maintenance costs of refrigeration (harder to keep the low temperatures at which these devices operate).

Further, the two side coating improves insulation, as the return current is well insulated from the incoming one due to the strong dielectric properties of sapphire at all temperatures.

Preferably, there is a protective, buffer, layer between the substrate and the superconductive layered structure described above. A layer is referred to as protective if it decreases the diffusion rate of atoms, for instance aluminum atoms, from the substrate to the superconductive layer. In exemplary embodiments, diffusion of aluminum towards the superconductive layer is practically prevented by the protective layer.

An exemplary protective layer is a layer of YSZ. Optionally, the thickness of an YSZ protective layer is 50-200 nm.

Thus, the present invention provides a novel superconductive layered structure including at least one bi-layered assembly formed by a desirable thick YBCO superconductive layer on top of a template YBCO layer, where the template YBCO layer has an intermediate value of the c-lattice parameter corresponding to non-superconductive state at a predetermined temperature conditions.

The superconductive layer is of $YBa_2Cu_3O_{7-x}$, also known as YBCO. The parameter x used in the formula of YBCO is a rational number between 0 and 7. There is at least one range, for example, between about 0.05 and about 0.3, wherein YBCO is superconductive. When x has a value out of such range, for example, when x>1, YBCO is not superconductive. An YBCO layer with x out of the superconductivity range will be referred herein as a non-superconductive layer.

As indicated above, the template layer is a relatively thin non-superconducting YBCO layer, located between the superconductive YBCO layer and the substrate, or preferably between the superconductive layer and the protective layer. The structure of the template layer fits that of the protective layer more closely than does the structure of the superconductive layer. This way, the template provides an intermediate layer having an intermediate structure, and allows thicker layers of superconductive YBCO to grow, than are grown without the template. Such fit between the template layer and the YSZ layer is achieved when the template layer comprises non-superconductive YBCO with a selected c lattice parameter, for example, YBCO with c-lattice parameter greater than 1.175 nm. Exemplary values of c parameters of template layers are between 1.178 and 1.180 nm, which correspond to x values of between about 0.8 and about 0.9. The second superconductive YBCO layer has a c lattice parameter of between 1.1169 and 1.171 nm.

In some embodiments, the value of x in the template layer is constant, and there is a sharp border between the template layer and the superconductive layer. In some embodiments, the value of x in the template layer is not constant. For example, in some embodiments the value of x progresses continuously from below 1 to about 0.1.

An aspect of some embodiments of the invention concerns a method of making the above-described structure of YBCO superconductive layer on a substrate, e.g. r-cut single crystal sapphire substrate. The method comprises deposition of a template non-superconductive YBCO layer to an r-cut sapphire substrate, where this template layer has a structure that fits the structure of the layer on which it grows better than does the superconductive YBCO layer; and then superconductive YBCO layer is deposited on the template layer.

In an exemplary embodiment, deposition comprises sputtering molecules from a superconducting YBCO target to the substrate. Template and superconductive layers are optionally obtained by sputtering first in an atmosphere having a lower partial pressure of oxygen (for example, 15-20% oxygen), and then in atmosphere of higher partial pressure of oxygen (for example, 55-60% oxygen).

Optionally, sputtering YBCO in atmosphere having the lower partial pressure of oxygen results in the formation of a template layer on the substrate. Additionally or alternatively, sputtering YBCO in atmosphere having the higher partial pressure of oxygen results in the formation of a superconductive layer on the substrate.

Optionally, forming the superconductive layer comprises continuous sputtering. Alternatively, forming the superconductive layer comprises intermittent sputtering, for example, two hours of sputtering followed by two hours intermission without sputtering, followed by additional two hours of sputtering. Optionally, the temperature of the substrate and the atmosphere during the intermission is the same as during sputtering.

Optionally, sputtering of the template layer and sputtering of the superconductive layer is at the same furnace temperature. This furnace temperature is optionally set such that a thermocouple whose position can be adjusted, is attached to the surface of the substrate before the sputtering begins reads a predetermined temperature. The temperature read by the thermocouple is referred to herein as the substrate temperature, although it is possible that the reading of the thermocouple is influenced also by radiation from the furnace, which heats the thermocouple through the transparent substrate.

When sputtering begins (after the thermocouple is removed from the substrate's surface) the furnace temperature is controlled by a thermocouple inside the furnace to stay at the same temperature it had at the moment of measurement by the retractable thermocouple.

Optionally, the furnace temperature during template layer sputtering corresponds to substrate temperature (as defined above) of between about 650° C. and about 680° C.

Optionally, the conditions for depositing the template layer are set in accordance with YBCO phase diagram, for example, at the above temperature range, sputtering of the template layer is at a pressure of between 40 and 80 mTorr.

Optionally, sputtering of the superconductive layer at the above temperature range is at a pressure of between 75 and 85 mTorr.

Generally, lower deposition rate results in more ordered layers. Optionally, deposition rate under the lower oxygen content is such that the YBCO template layer grows in 0.02-0.04 nm per second. Optionally, deposition rate under the higher oxygen content is such that the YBCO superconductive layer grows in between about 0.015 and about 0.03 nm per second.

In some preferred embodiments, the deposition is stopped without renewing when the superconductive layer has thickness of 600 nm or more.

In some other preferred embodiments, the deposition is stopped without renewing when the superconductive layer has thickness of between 10 nm and 50 nm.

Optionally, the deposition is stopped without renewing when the superconductive layer is of an intermediate thickness of between 50 nm and 600 nm.

Optionally, after the deposition is stopped without renewing, the obtained layer is exposed to ambient conditions.

In some preferred embodiments of the invention, the sapphire substrate comprises a protective layer, and the deposition is on the protective layer.

Optionally, depositing comprises sputtering.

Optionally, the protective layer comprises YSZ.

In some embodiments of the invention, a method of making a superconducting layer of YBCO on a substrate comprises forming on the substrate a protective layer of YSZ. Optionally, the furnace temperature during YSZ sputtering corresponds to substrate temperature (as defined above) of between about 890° C. and about 930° C. In some embodiments, this temperature corresponds to substrate temperature of between 905 and 915° C., for example, 910° C.

Alternatively or additionally, a method of making a superconducting layer of YBCO on a substrate comprises providing an YSZ-protected substrate.

An aspect of some embodiments of the invention concerns a method of making an YSZ-protected substrate. In a preferred embodiment, the method comprises sputtering YSZ on a substrate at a temperature of between 905 and 915° C. to obtain the protected substrate.

Optionally, the method also comprises cooling the protected substrate to ambient temperature, for example between −10° C. to 40° C., optionally between 20 and 30° C. Alternatively or additionally, the method also comprises exposing the protected layer to atmospheric pressure. Alternatively or additionally, the method also comprises exposing the protected substrate to ambient atmosphere. In this context, ambient atmosphere comprises air. Optionally, ambient atmosphere also comprises water vapor.

An aspect of some embodiments of the invention concerns YSZ-protected sapphire substrate held under ambient conditions. Optionally, the ambient conditions comprise temperature of below 50° C., for example 20-30° C. Alternatively or additionally, the ambient conditions comprise atmospheric pressure. Optionally, the ambient conditions comprise atmosphere comprising air with or without water vapor.

Thus, according to one broad aspect of the invention, there is provided superconductive layered structure for placing on a substrate structure. The superconductive layered structure comprises a stack including at least one bi-layered assembly formed by first and second layers of similar superconducting material compositions, the second layer being superconductive at predetermined temperature condition, the first layer being a substantially thin layer and having a c lattice parameter selected in accordance with those of the substrate structure and the second layer, such that said first layer is non-superconductive at said predetermined temperature condition thereby allowing the second superconductive layer to be desirably thick to provide high critical current density of the superconductive layer.

The bi-layered assembly may comprise the first non-superconductive layer of a compound of the formula $YBa_2Cu_3O_{7-x}$ (YBCO), and the second superconductive layer of YBCO on top thereof, where the first YBCO layer serves as a template layer to provide a desired relation between c lattice parameters and thicknesses of the first layer of YBCO and the second layer of YBCO. Preferably, the first template layer has a thickness substantially not exceeding 50 nm and has the c lattice parameter of at least 1.175 nm being therefore non-superconductive at temperature above at least 77K, and the second superconductive layer of YBCO has a thickness of at least 300 nm and has the c lattice parameter of between 1.1169 and 1.171 nm.

The second layer of YBCO may have a surface area between 10 $cm^2$ and 100 $cm^2$, as well as ma have a thickness of between 10 nm and 50 nm, or between 600 nm and 1500 nm.

In some embodiments, the superconductive layered structure comprises at least two of the above-described bi-layered assemblies located one on top of the other, such that the first layer of a successive bi-layered assembly is located on the second layer of a preceding bi-layered assembly.

According to another broad aspect of the invention, there is provided an article comprising a substrate structure, and the above-described superconductive layered structure.

In accordance with an exemplary embodiment of the invention, there is provided an article comprising a sapphire substrate carrying a superconductive layer of a compound of the formula $YBa_2Cu_3O_{7-x}$ (YBCO), the layer having surface area of at least 10 $cm^2$, thickness of at least 600 nm, and critical current of at least 100 A/cm width at a temperature of 77K or higher. Optionally, the superconductive layer has surface area of up to 100 $cm^2$. Optionally, the superconductive layer has thickness of up to 1500 nm. The superconductive layer is located on a template layer of YBCO having a c lattice parameter of at least 1.175 nm.

Preferably, the article comprises a layer of Yttrium Stabilized Zirconium (YSZ) between the (e.g. sapphire) substrate and the superconductive layered structure, I.e. between the substrate and the template layer.

In an exemplary embodiment, the article comprises a sapphire substrate; an YSZ layer on a surface of the substrate, and two or more bi-layers one on top of the other, each bi-layer comprising a first YBCO layer having a c lattice parameter of at least 1.175 nm and a second YBCO layer having a c lattice parameter of between 1.1169 and 1.171 nm.

There is also provided in accordance with an exemplary embodiment of the invention a method of making the above described article, the method comprising:

(a) providing the substrate structure formed by a substrate having a surface with at least a portion thereof covered with an YSZ layer;

(b) depositing YBCO onto the YSZ layer so as to form the first template layer of a predetermined, relatively small, thickness and having a c lattice parameter of at least 1.175 nm, thereby providing the non-superconductive YBCO layer; and (c) depositing YBCO onto the first template layer so as to form an YBCO layer of a predetermined, relatively large, thickness having a c lattice parameter of between 1.1169 and 1.171 nm.

Optionally, actions (c) and (d) are repeated more than once.

In some embodiments, said surface of the substrate structure on which the YBCO layers are deposited is substantially planar.

In some embodiments, depositing YBCO to form a YBCO layer having a c lattice parameter of at least 1.175 nm comprises sputtering YBCO under a first partial pressure of oxygen; and depositing YBCO so as to form an YBCO layer having a c lattice parameter of 1.169 nm comprises sputtering YBCO under a second partial pressure of oxygen.

Optionally, the first partial pressure of oxygen is between 10% and 20%. Alternatively or additionally, the second partial pressure of oxygen is greater than 45%.

Optionally, sputtering comprises intermittent sputtering.

In some embodiments, the method comprises stopping the deposition of YBCO on a template layer when the thickness of the layer being deposited is between 10 nm and 50 nm. In some embodiment, the method comprises stopping the deposition of YBCO on a template layer when the thickness of the layer being deposited is 600 nm or more.

In an exemplary embodiment, providing an r-cut sapphire substrate having a surface covered with an YSZ layer comprises:

providing an r-cut sapphire substrate; and sputtering on the r-cut sapphire substrate YSZ under an atmosphere consisting essentially of oxygen.

Optionally, in the latter embodiment, sputtering is at a substrate temperature of between 905 and 915° C.

Optionally, the method comprises radiating the substrate so as to heat it to said substrate temperature.

Optionally, the method comprises cooling the substrate with the YSZ layer to room temperature. Alternatively or additionally, the method comprises exposing the substrate with the YSZ layer to ambient air.

There is also provided in accordance with an exemplary embodiment of the invention a sapphire substrate covered with an YSZ layer obtained in a method comprising:

providing an r-cut sapphire substrate; and sputtering on the r-cut sapphire substrate YSZ under an atmosphere consisting essentially of oxygen.

Optionally, the method comprises sputtering at a substrate temperature of between 890 and 930° C.

Optionally, the method comprises radiating the substrate so as to heat it to said temperature.

There is also provided in accordance with an exemplary embodiment of the invention a sapphire substrate exposed to ambient environment, the substrate having at least one face covered with a layer of YSZ.

In some embodiments, the ambient environment comprises an atmospheric pressure of air. Optionally, the air is between −40° C. and 45° C.

There is also provided in accordance with an exemplary embodiment, a method of making an YSZ layer on a sapphire substrate, the method comprising:

heating the substrate to a substrate temperature above 680° C., optionally between 890° C. and 930° C.; and sputtering YSZ onto the heated substrate under an atmosphere consisting essentially of oxygen.

Optionally, the sputtering is at pressure of between 4 and 6 mTorr.

In some embodiments, the method comprises cooling the substrate with the YSZ layer to room temperature. Additionally or alternatively, the method comprises exposing the substrate with the YSZ layer to ambient air.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 13B is a schematically illustrated side view of a system for coating sapphire wires according to an exemplary embodiment;

FIG. 13C is a schematic perspective view of an r-cut sapphire wire before coating; and FIG. 13D is a cross-section of a wire obtainable from the wire shown in FIG. 13C by coating it with YSZ and YBCO in accordance with an embodiment of the present invention.

DETAILED DESCRIPTION OF EMBODIMENTS

The present invention relates, in some embodiments thereof, to a sapphire substrate having on it an YSZ buffer layer. In some embodiments, the substrate also has a superconductive YBCO layer.

Exemplary Superconductive Layer

An aspect of some embodiments of the invention concerns an article comprising a substrate with a superconductive layer grown thereon.

Figures 1A, 1B:
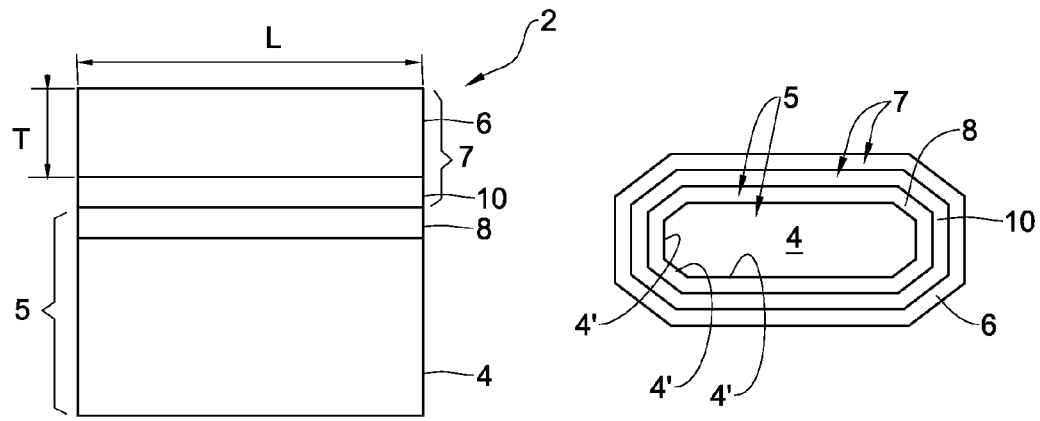
FIG. 1A is a schematic illustration of an article according to an exemplary embodiment of the invention.
FIG. 1B is a schematic illustration of a cross-section in a wire-shaped article according to an exemplary embodiment of the invention.

FIG. 1A is a schematic illustration of an article (2) according to an exemplary embodiment of the invention.

The article 2 is shown to include a substrate structure including a substrate (4), e.g. sapphire substrate, carrying a superconductive layered structure (7) of the present invention. The layered structure (7) includes at least one bi-layered assembly formed by a relatively thick superconductive layer (6) of a compound of the formula $YBa_2Cu_3O_{7-x}$ (YBCO) on top of a relatively thin layer (10) of non-superconductive YBCO. Composition 2 also has a layer (8) of Yttrium Supported Zirconium (YSZ) between the substrate 4 and the non-superconductive YBCO layer (10).

A structure formed by the substrate 4 and the protective layer 8 presents a substrate structure marked as (5), and may be prepared in situ or separately, as discussed below.

Superconductive layer 6 has a length L and thickness T. The layer also has width W, not shown, as it lies on a plane perpendicular to the plane of the drawing.

It should be noted, although not specifically shown here, that the superconductive layered structure 7 of the invention may include more than one of the above-described bi-layered structures. In such configuration, the be-layered structures are located one on top of the other.

FIG. 1B is a schematic illustration of a cross-section in an article similar to that illustrated in FIG. 1A, but more specifically exemplifying the two-side superconductive film coating. In this non-limiting example, the substrate (4) is an r-cut sapphire configured as a wire. The wire has six faces 4', each being, for example, a [1012] plane, and is obtainable in accordance with the method described in Ref 14.

As shown in the figure, the superconductive structure 7, which in the present example is in the form of a single bi-layered structure, covers the entire outer surface of the substrate structure 5. It should be noted that, generally, the superconductive structure of the invention is located on at least a part of the surface of the substrate, and in case of two-side configuration, the superconductive structure is located on at least two opposite surface portions of the substrate structure.

Dimensions of the Different Layers

In some embodiments, the surface area of the superconductive layer is between about 10 and about 100 $cm^2$.

In some embodiments, a lateral size L of the superconductive layer 6 is 2.5 cm or more. Some exemplary sizes are 2.5 cm, 5 cm, 8 cm, and 10 cm.

Similarly, in some embodiments of the invention, width W of superconductive layer 6 is 2.5 cm or more. Some exemplary sizes are 2.5 cm, 5 cm, 8 cm, and 10 cm.

In some exemplary embodiments of the invention conductive layer 6 is disk-shaped, having equal length and width.

It is sometimes convenient to prepare a disk-shaped superconductive layer 6, and then cut it (with the underlying layers) to have other shapes, as may be required for further processing or use.

In different embodiments of the invention, thickness T of layer 2 varies between about 10 nm to about 1500 nm. Of particular interest are very thin layers, wherein T is between 10 nm and 50 nm, and relatively thick layers, wherein T is 600 nm or greater. Some properties and uses of very thin layers and relatively thick layers are described below.

The thickness of buffer layer 8 is optionally between about 80 nm and about 110 nm. Buffer layer 8 covers an entire surface of substrate 4, or a portion thereof.

Considering the two-side coating configuration, the layered structure 7 of the invention (formed by one or more bi-layered assemblies) is formed on two opposite planar sides of the substrate or along the entire outer surface of the substrate (circumference or perimeter).

The thickness of template layer 10 is optionally between about 20 nm and about 30 nm. The bi-layered structure, formed by non-superconductive template layer 10 and superconductive layer 6, covers the entire surface of buffer layer 8, or a portion thereof.

Exemplary Method of Making a Superconductive Layer

An aspect of some embodiments of the invention concerns a method of making a superconductive layer on a substrate.

Figure 2:
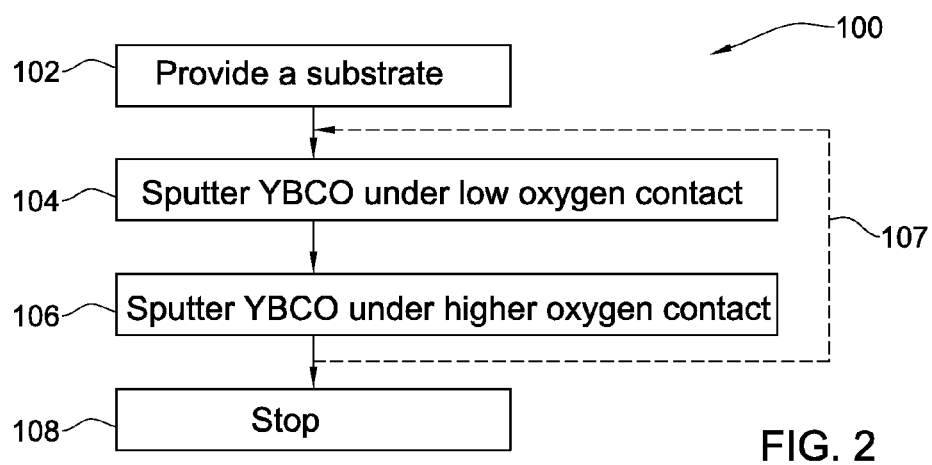
FIG. 2 is a flowchart of actions taken in a method of making a superconductive layer according to a preferred embodiment of the invention.

FIG. 2 is a flowchart of actions taken in a method 100 of making a superconductive layered structure according to an embodiment of the invention, such as the superconductive layered structure of FIGS. 1A and 1B.

At 102, a substrate structure is provided, preferably single crystal sapphire substrate having an (1012) plane covered with an YSZ layer (see part 5 of FIG. 1). In some embodiments, the YSZ protected substrate (e.g. sapphire) is provided as a single unit, prepared in advance, and optionally kept at ambient environment. In some other embodiments, the YSZ protected sapphire is provided by in situ preparation. Protecting the sapphire with an YSZ layer according to an exemplary embodiment of the invention is described below under the heading "exemplary making of an YSZ layer".

At 104, YBCO is sputtered from an YBCO target. Optionally, the YBCO target is superconductive.

Optionally, YBCO sputtering comprises off axis dc magnetron sputtering from an YBCO ($YBa_2Cu_3O_{7-x}$) stoichiometric target with x between 0.05 and 0.30. Exemplary sputtering conditions are furnace temperature corresponding to substrate temperature of between about 650° C. and about 680° C., under pressure of between about 40 and about 50 mTorr of a gas mixture, optionally comprising less than 30% oxygen, for example 15-20% oxygen. The rest of the gas mixture is optionally an inert gas or gas mixture, for instance, argon.

An exemplary setup for measuring the temperature of the substrate is described below under the heading "Exemplary temperature measurements".

Exemplary value of dc power on the target is 80-140 W. Dc power of 140 W was found to yield a sputtering rate of about 0.03 nm/sec. An annealing process in pure oxygen is optionally performed, optionally for about 16 hours at approximately 500° C.

The sputtering at action 104 is designed to form a layer having a structure that is intermediate between that of the underlying YSZ layer and that of the layer that will be sputtered on it in action 106 discussed below.

At 106, similarly to 104, YBCO is sputtered from an YBCO target; but here, the partial pressure of oxygen in the gas mixture is higher, to ensure superconductivity of the resultant layer. Optionally, the partial pressure of oxygen is more than 45%, for example, 55-60%. Optionally, the pressure is also higher, for example, 75-85 mTorr.

In an exemplary embodiment, the partial pressure of oxygen in the atmosphere under which YBCO is sputtered in action 106 is increased by adding oxygen to the atmosphere, thus raising both the partial pressure of oxygen and the overall pressure.

In some embodiments, when the oxygen is added sputtering is stopped, so as to sputter the YBCO under two distinct conditions: lower oxygen pressure and higher oxygen pressure.

In some embodiments, oxygen is added while sputtering continues. For instance, in some embodiments, the oxygen is added such that the pressure is fully raised within 5 minutes, leading to working for these 5 minutes under intermediate and gradually increasing oxygen contents. In some cases, sputtering under gradually increasing oxygen content results in the formation of a layer of intermediate and progressing oxygen content.

Optionally, sputtering at action 106 is intermittent. In some embodiments it was shown that sputtering for two hours, and then shutting down the power of the sputtering gun for two hours, and then turning it on again results in more ordered superconductive layers. Without being bound to theory, it may be suggested that some reordering takes place during the intermission time.

Optionally, sputtering action 106 is followed by annealing.

At 108, growth of the superconductive layer is stopped. Stopping the layer growth optionally comprises stopping the sputtering, cooling the layer, for example, to room temperature, and/or exposing the layer to ambient atmosphere, which typically comprises air, optionally with water vapor, and may also comprise other components.

In some embodiments, the growth is stopped when the superconductive layer is between about 10 and about 50 nm. If the sputtering rate is 0.03 nm/sec, this means stopping action 106 after between about 5 and about 25 minutes.

In some embodiments, the growth is stopped when the superconductive layer is 600 nm thick or more.

Stopping the growth after a layer of intermediate growth of between 50 and 600 nm of the superconductive layer is also within the scope of some embodiments.

Optionally, before the process is stopped, actions 104 and 106 are repeated any desirable number of time, for instance, 1, 2, 3, or 10 times (see arrow 107). In such a case, the obtained substrate has on it a plurality of bi-layered structures formed by superconductive YBCO layers intercalated by non-superconductive YBCO template layers.

Exemplary Making of YSZ Layer

An aspect of some embodiments of the invention concerns growing YSZ on sapphire.

Figure 3:
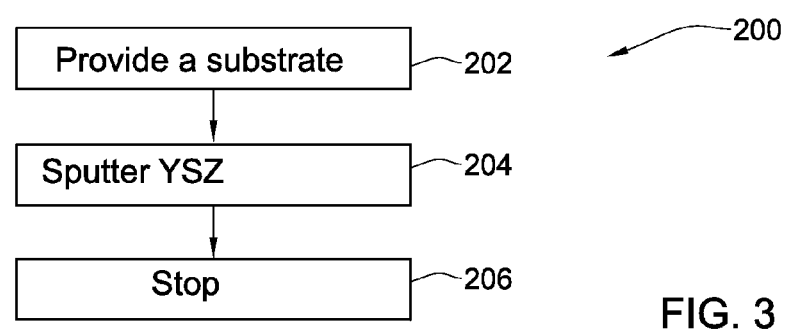
FIG. 3 is a flowchart of actions taken in a method of growing YSZ on sapphire according to an embodiment of the invention.

FIG. 3 is a flowchart of actions taken in a method 200 of growing YSZ on sapphire according to an embodiment of the invention.

Method 200 is optionally used for providing the YSZ-protected substrate in a method as described in FIG. 2.

At 202, a sapphire substrate is provided, optionally after standard cleaning, for example, with acetone and ethanol, as well known in the art. The sapphire usually used by the inventor is r-cut sapphire wafer manufactured by ALMAZ optics, USA. Optionally, the sapphire is an r-cut sapphire wire, as described in Ref. 14.

At 204, YSZ is deposited, on the provided substrate, by sputtering, pulsed laser deposition (PLD), and/or any other available technique. Optionally, the YSZ layer is grown by off axis dc magnetron sputtering from a stoichiometric single target. Optionally, the target comprises 95% $Y_2O_3$ and about 5% $ZrO_2$. The YSZ layer is sputtered at about 4-6, for example, 5 mTorr of oxygen with the substrate at about 905 to about 915° C.

At 206 growing the YSZ is stopped.

In some embodiments, stopping the growth comprises cooling only to about 700° C., and in situ further processing the YSZ-protected sapphire, for instance, in a method as described in FIG. 2 above.

In some embodiments, stopping the growth comprises cooling to room temperature and/or exposing to ambient atmosphere. Room temperature is usually between −40 and 45° C., for example, between 20 and 25° C.

Exemplary Heating Apparatus

In some embodiments, a substrate is heated to temperatures of between about 680° C. and about 915° C. It is preferable that the temperature of the substrate is uniform, for example, it is usually preferred that a disk-shaped substrate of 7.5 cm in diameter will be entirely at the same temperature, with deviations of no more than 5° C. from one point to another.

Figure 4A:
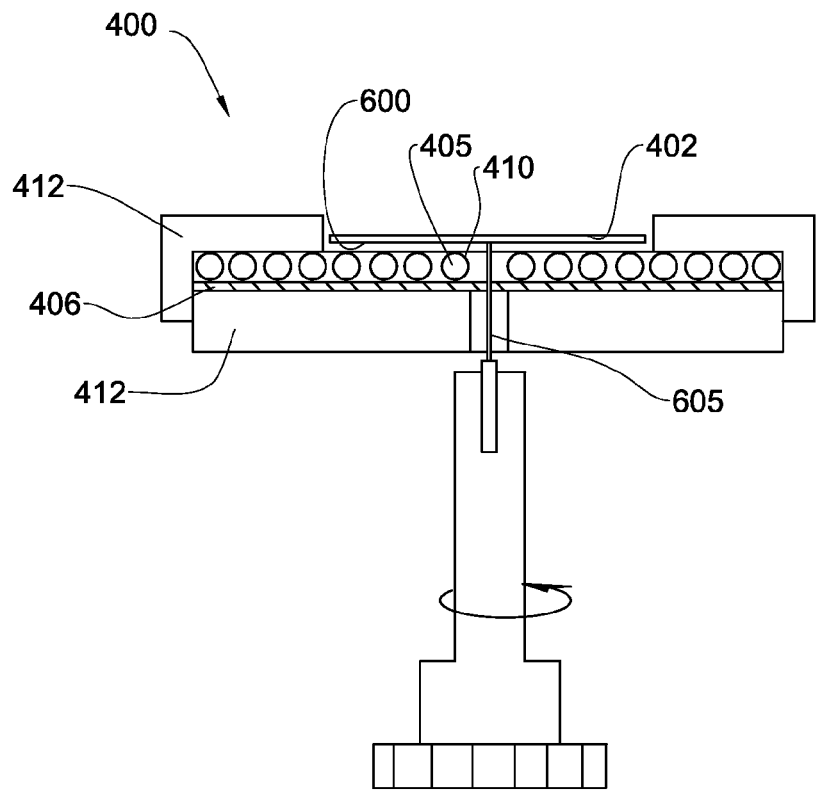
FIGS. 4A and 4B are schematic illustrations of a side view and an upper view of an open furnace suitable for heating a substrate according to some embodiments of the invention.
Figure 4B:
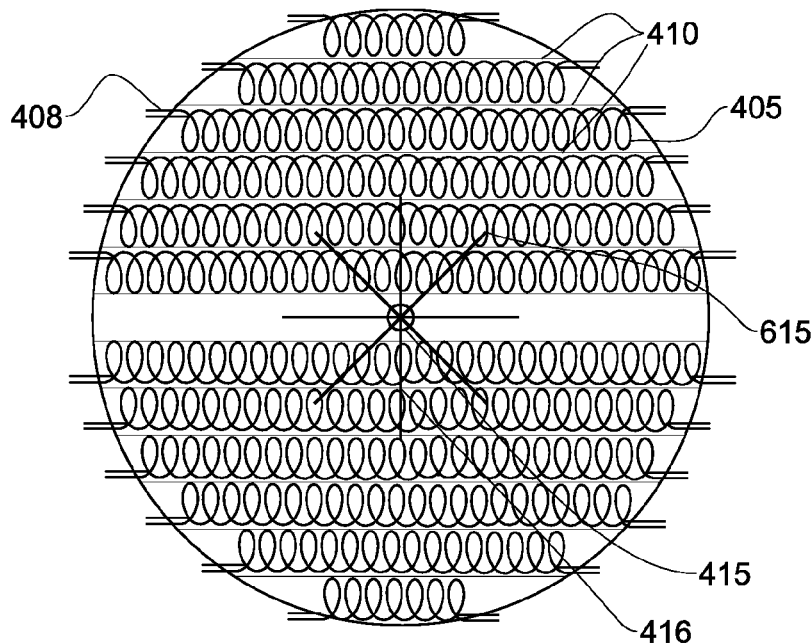

To achieve such accurate temperature distribution over large areas of between about 10 and about 100 $cm^2$, for example, about 44 $cm^2$, the inventors developed a special furnace FIGS. 4A and 4B are schematic illustration of a side view and upper view, respectively, of a furnace 400 suitable for heating a substrate according to some embodiments of the invention.

In furnace 400, a substrate 402 (not shown in FIG. 4B, in order not to hide the heating wires) is heated by radiation from heated wires (405) placed inside tubes (410). Wires 405 are optionally commercial resistance wires, for example, RW155 from AircraftmaterialsUK.com, which can stand temperatures as high as 1400° C. Optionally, the wires are all electrically connected to each other so as to form a single electrical resistor. Tubes 410 protect substrate 402 from materials released from wires 405 when the wires are heated, without interfering with the heating provided by the wires. Preferably, tubes 410 are made of quartz, which is transparent to IR radiation. Optionally, surface 406 below wires 405 (not shown in FIG. 4B) is reflective, so as to reflect heating radiation approaching the surface from the wires, and directing them to the sample.

Optionally, wires 405 are wound into spiral helixes, and the packing density of each of the wires is controlled independently of the other to achieve best temperature homogeneity. Optionally, the packing density is controlled with screws (408) attached to the ends of each of wires 405, such that scrolling the screw changes the packing density. Optionally, the packing densities of each of the various wires 405 are controlled to homogeneously heat a substrate. This is optionally done in a trial and error process. Optionally, the temperatures at different portions of the furnace are evaluated by color of the black body radiation emitted from the wires. This control of packing density, also referred herein as calibration of the furnace, is optionally done once for the entire lifetime of the furnace. Optionally, a finer calibration is carried out with the temperature being measured with a thermocouple, as described below under the heading of "exemplary temperature measurement".

Optionally, the number of turns in each tube is carefully adjusted in advance to provide a good starting point for the above-described trial and error process.

Optionally, body 412 of furnace 400 is made of alumina or other suitable material of high heat resistance and low thermal conductivity.

Figure 6:
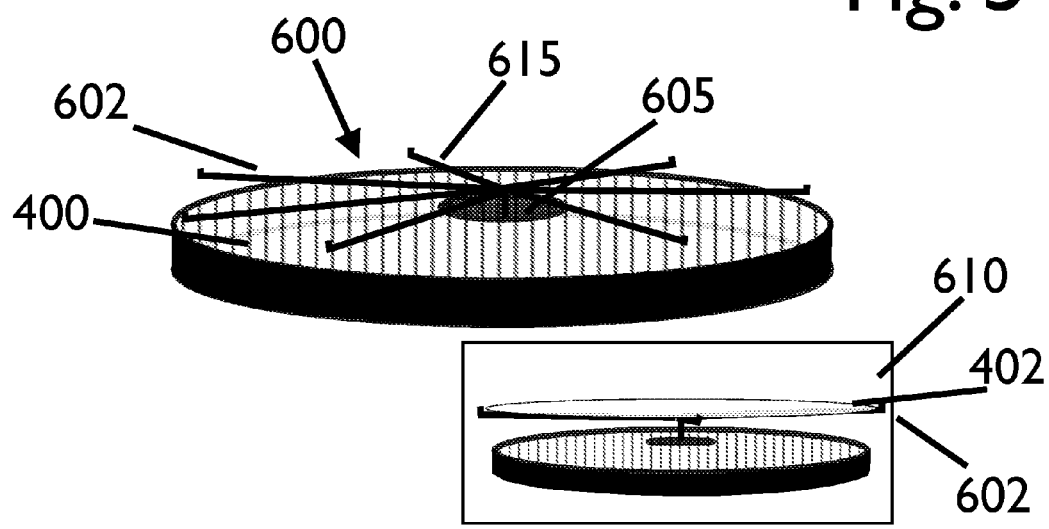
FIG. 6 is a photograph of a sample holder suitable for holding a sample during processing according to some embodiments of the invention.

At the center of furnace 400 there is shown an aperture 415 (FIG. 4B), for attaching to the furnace a sample holder 600, photographed in FIG. 6.

Figure 5:
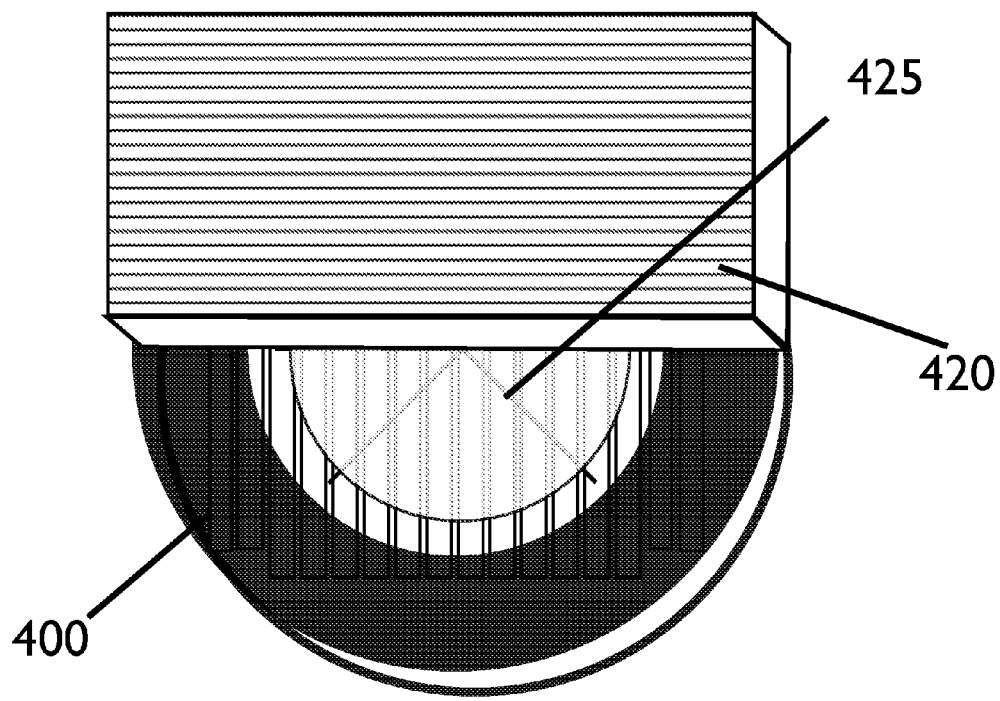
FIG. 5 is a photograph of a half-open furnace suitable for heating a substrate according to some embodiments of the invention.

To achieve higher temperatures, for example, as high as required in YSZ growth according to some embodiments, an additional heating element 420 is placed on top of the wafer (425), as shown in FIG. 5. Heating element 420 is optionally another furnace of the kind described in FIGS. 4A and 4B. Heating element 420 is placed above furnace 400 so as to cover wafer 425 wholly or partially. During sputtering, partial coverage is preferred.

In operation, wafer 402 is rotated on holder 600 with the center above aperture 415. When an upper heating element 420 is used, part of the wafer is between furnace 400 and heating element 420, and the rest of the wafer is heated only by furnace 400. Optionally, sample holder 600 rotates so as to constantly change the wafer portions that are heated by the heating element. The portions not covered by the heating element are optionally free to receive scattered molecules for forming a layer on the uncovered wafer portions.

An exemplary sample holder 600 is photographed in FIG. 6. The shown wafer holder is rotatable to allow better temperature homogeneity during heating. The holder (600) includes a quartz pin 605, which is short enough to allow close proximity of sample (402) to heating elements (405, 410) of the furnace 400 when the pin is inserted in aperture 415. In this context, a distance between about 1 and 4 mm is considered "close proximity". Holding the sample in close proximity to the furnace, allows minimizing heat loss, and with it, minimizing the heating power. The pin material, which preferably is quartz, holder diameter, which is optionally only slightly larger than the size of the wafer held thereby, holder design, which is optionally between 6 and 8 equally spaced thin quartz legs, and length, designed to hold the wafer in proximity of the furnace, cooperate in reducing heat loss from the center of the wafer, and improving the uniformity of the temperature distribution in the sample. The holder optionally has several (for example, 4 to 8) legs 615 attached to quartz pin 605 and adapted to receive thereon the sample. Optionally, legs 615 have curved ends (620) for preventing the sample from slipping from the holder.

Exemplary Temperature Measurements

Figure 7:
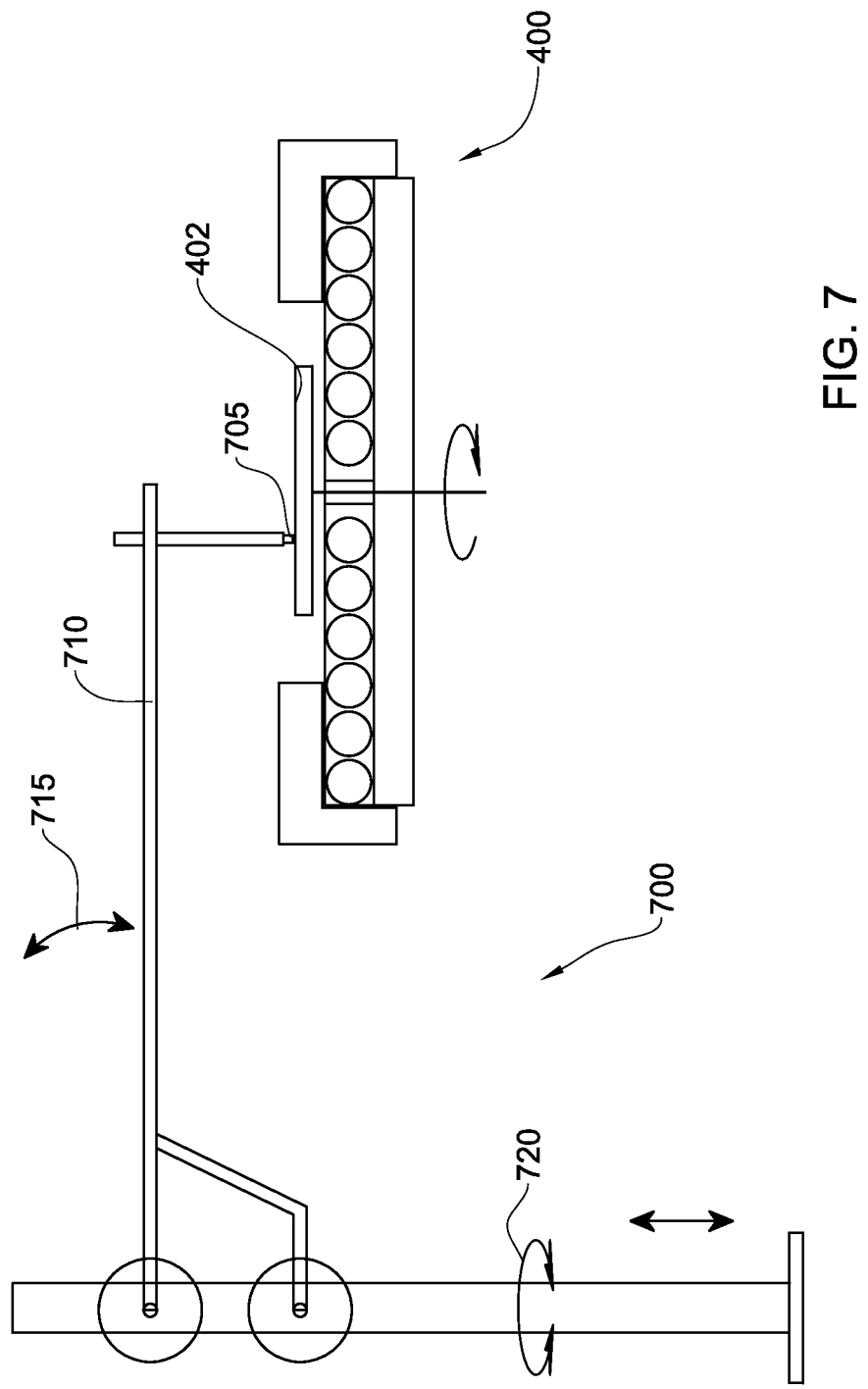
FIG. 7 is a schematic illustration of a temperature measuring apparatus according to an embodiment of the invention.

In some embodiments of the invention, the temperature of the substrate is accurately measured at least before the beginning of the growth. FIG. 7 is a schematic illustration of a device 700 for measuring temperature of a sample 402 heated with a furnace 400. Optionally, system 700 comprises a thermocouple 705, placed on the surface of substrate 402. The accuracy of the measurement is optionally to ±0.5° C.

However, during sputtering it is very difficult to measure the temperature accurately, since it is practically impossible to place a thermocouple on the rotating sample during heating. Optionally, during sputtering, a thermocouple that measures the furnace temperature (rather than the sample temperature) is used. The temperature difference between the furnace and the sample before sputtering is assumed to be the same during sputtering, and therefore, furnace temperature is indicative of the sample temperature.

The temperatures recited in the present description and claims were measured with a device similar to device 700, configured to measure the temperature of wafer 402 before the beginning of the growth. A thermocouple 705 was connected at one end of one arm 710 of a lever which is free moveable upwards and downwards (see arrow 715), similar to a Hi-Fi pick-up arm. Still similar to a Hi-Fi pick-up arm, arm 710 is also rotatable (see arrow 720) so as to be deliverable to different parts of the wafer. When thermocouple 705 is lowered, the weight of the lever's arm and thermocouple assures contact of the thermocouple with the substrate surface with minimal pressure to the surface. Preferably, the pressure is small enough not to bend the holder and not to change the distance between any portion of the sample and the furnace. Optionally, the thermocouple is controllable to contact the sample at different distances from the center, thus allowing temperature reading at different points, which is particularly useful during furnace calibration. Optionally, substrate temperature is measured at the beginning of each growth process, compared to the furnace temperature, and from this point on, the growth temperature is evaluated by the furnace temperature and the difference between it and the sample temperature as measured before growth began.

Experimental Results

Critical Current

Figure 8A:
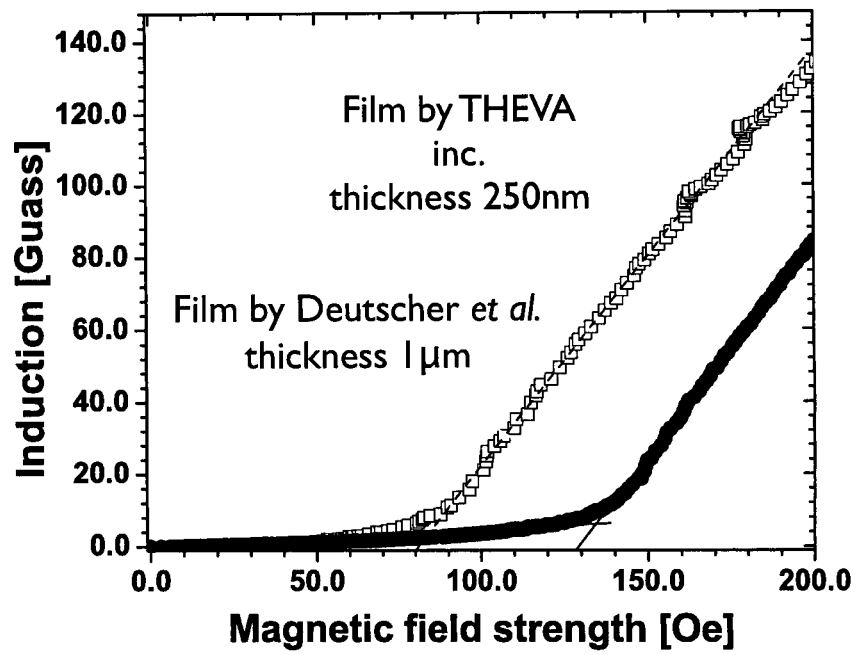
FIG. 8A is a graph showing results of magnetic penetration measurements made with a 1000 nm thick superconductive layer according to an embodiment of the invention (squares) and of a 250 nm layer commercially available from THEVA.
Figure 8B:
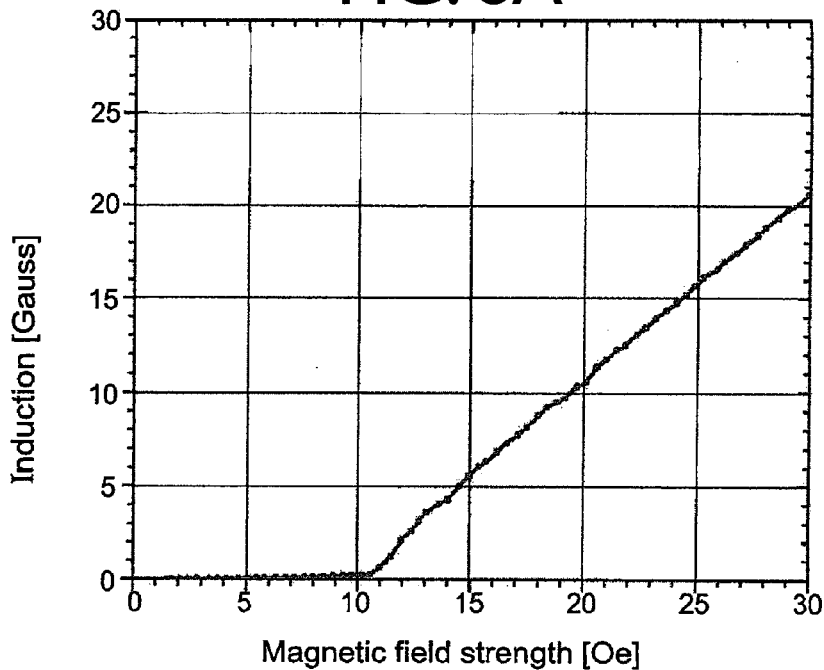
FIG. 8B is a graph showing results of magnetic penetration measurements made with a 40 nm thick superconductive layer according to an embodiment of the invention.

FIGS. 8A and 8B show the variations of the induction field measured at the center of a 3" YBCO film as a function of the external magnetic field applied perpendicular to the wafer. The curves show break points, at which increasing the magnetic field dramatically increases the induction. Following reference 13, the magnetic field value at this point is defined as the penetration field. The graphs of FIG. 8A show the penetration field of a 1000 nm thick superconductive layer according to an embodiment of the invention and of a 250 nm layer commercially available from THEVA Dünnschichttechnik GmbH, Germany (K Develos et. Al.) The graph of FIG. 8B shows the penetration field of a 40 nm thick superconductive layer according to an embodiment of the invention. The thickness was evaluated from a SEM image (not shown).

The penetration fields are shown to be 83 Oe for the 250 nm layer of THEVA, 134 Oe for the 1000 nm layer and 11 Oe for the 40 nm layer.

The penetration field is proportional to the critical current per unit width. Thus, FIG. 8A shows that the layer according to the embodiment of the invention is 4 times thicker and has a critical current per cm width that is about 50% greater than that of the commercially available product.

Figure 9:
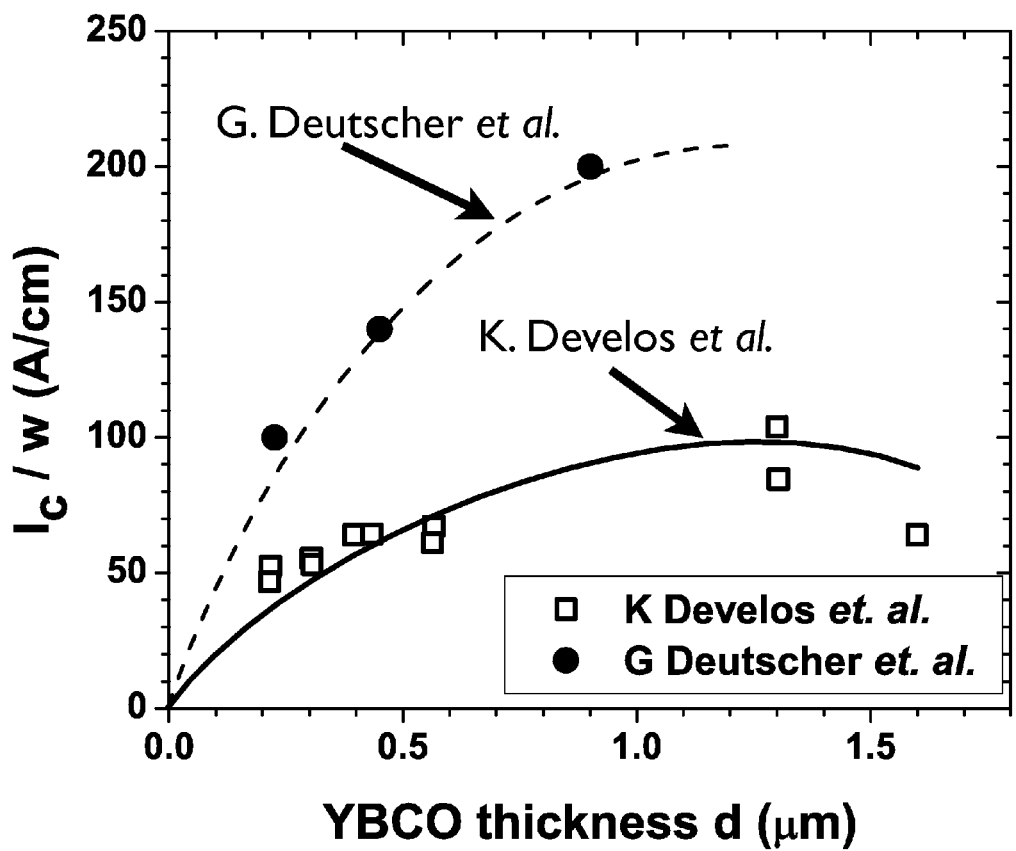
FIG. 9 is a graph showing critical currents of superconductive layers of different thicknesses obtained according to some embodiments compared with results reported in ref 9 (K. Develos et al.)

FIG. 9 shows the critical current per unit width for different film thicknesses obtained according to some embodiments and reported by Develos et al. The lines are provided for guiding the eye.

Exemplary Template Layer

Figure 10:
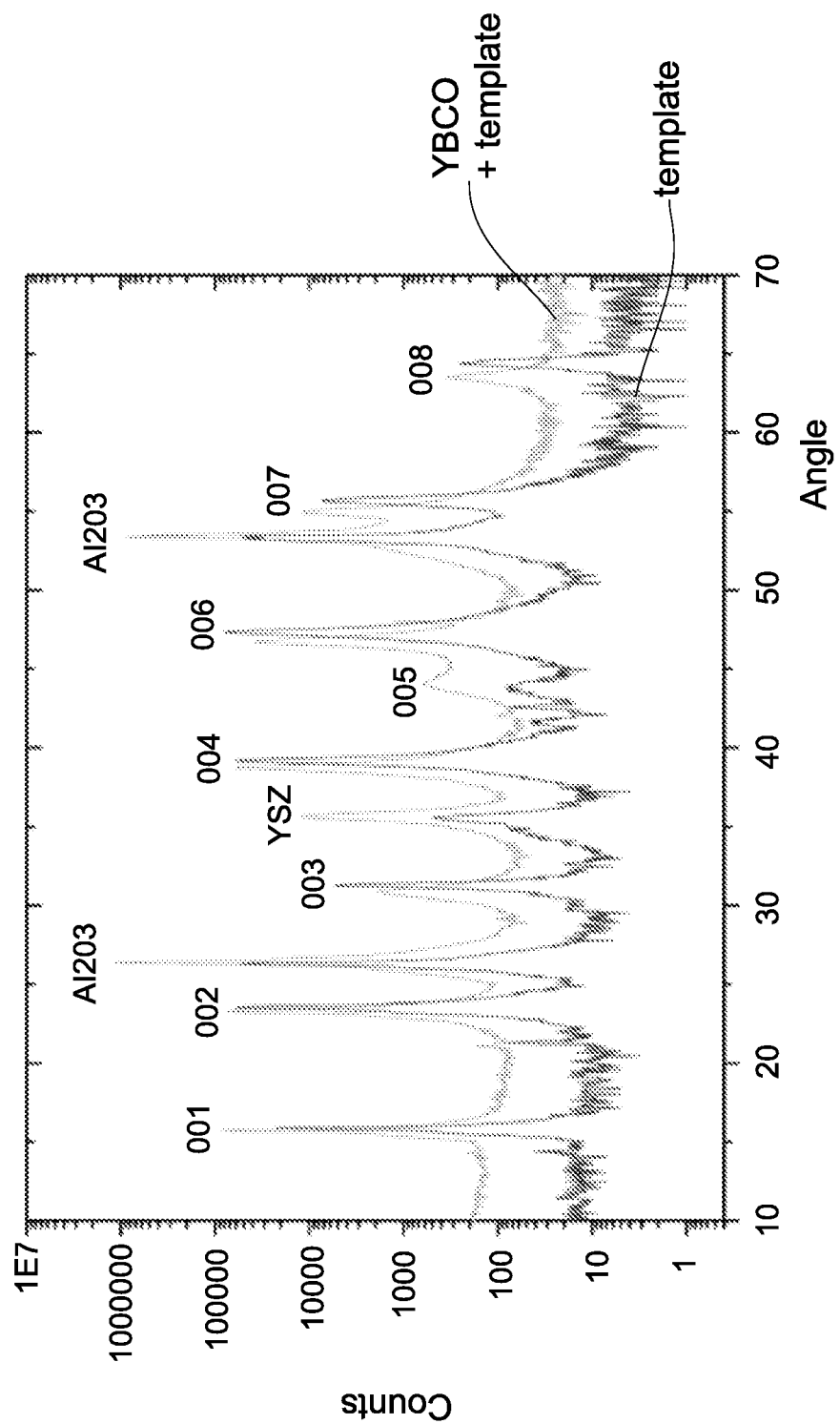
FIG. 10 is an X-Ray diffraction spectrum of a template layer and of an YBCO layer on top of the template (green), according to some embodiments of the invention.

FIG. 10 is an X-Ray diffraction spectrum of a template layer alone and a superconductive YBCO layer on top of the template. The observed shifts in the peaks numbered from 001 to 008 are associated with a difference in the lattice parameter between the layers. The peaks were analyzed to show that the template layer alone has a c-parameter of 1.179, which corresponds to x value of 0.85, at which YBCO is known to be not superconductive.

Exemplary Coated Sapphire Wire

In some embodiments, the substrate is an r-cut sapphire fiber, tape, or ribbon, obtainable as described in US Patent Application Publication No. 2009-0081456 to Goyal, incorporated herein by reference in its entirety (hereinafter Goyal). Such substrates are referred herein generally as sapphire wires.

Exemplary dimensions of sapphire wire substrate are as described by Goyal, for example: length larger than width by factor of at least 10, length of between 1 m and 1000 m, thickness of between 50 and 400 micrometers and width of between 100 micrometers and 25 cm.

In some embodiments, for example, when the wire is short and/or flexible enough to be placed on a disk having a surface area of about 100 cm², the wire may be coated with YSZ and YBCO using the above-described systems.

In some embodiments, for example, when the wire is too long and/or not flexible enough to be treated in the above-describe system, an alternative coating system may be applied.

In one embodiment, a system for coating a long wire will include two spoolers, one for feeding in pristine wire, and one for collecting coated wire. A wire stretched between the two spoolers will go through a heating unit having heaters spaced along the wire, optionally perpendicularly to the wire. In an exemplary embodiment, heaters will be placed at both sides of the wires.

Along the wire there will be at least one sputtering station, comprising a target, for example YBCO target or YSZ target, connected to a voltage source.

In some embodiments, the sputtering station will be free of heaters, to allow sputtered material reaching the wire. Optionally, the target is at one side of the wire, and the other side includes heaters.

The region between the two spoolers, and optionally the spoolers themselves, will be kept under atmosphere suitable for sputtering from the target, as described above.

The heaters will heat the wire to the suitable temperatures, as described above.

The collecting spooler will rotate to collect wire from the feed-in spooler, to move the wire through the sputtering station(s). The rotation will optionally be continuous. In some embodiments, the rotation will be adapted for ensuring a constant rate of linear motion between the two spoolers. This will require slower rotations in later stages of the coating process, when the spooler collected wire and gained a larger effective diameter.

Figure 13A:
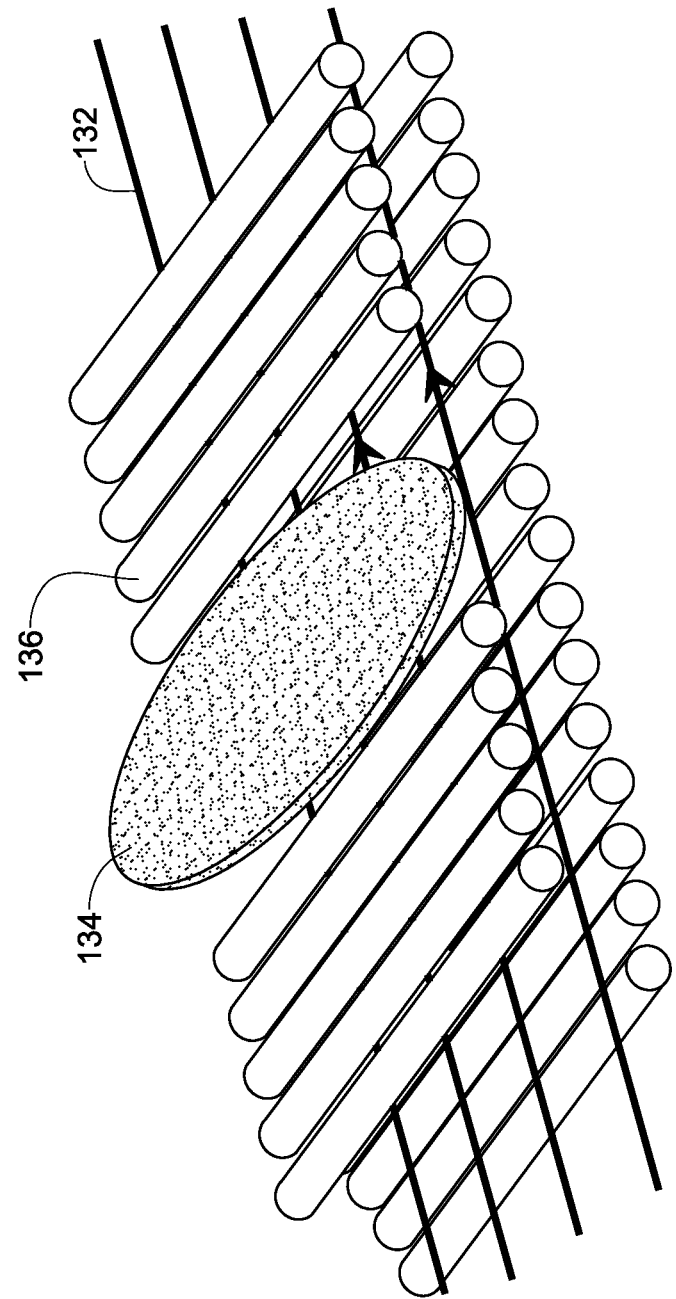
FIG. 13A is a schematically illustrated perspective view of sapphire wires when being coated according to an embodiment of the invention.

FIG. 13A is a schematically illustrated perspective view of sapphire wires 132 when being coated with YSZ or YBCO according to one possible embodiment. Four wires are shown in the figure, but similar embodiments with other numbers of wires, for example, between 1 and 10, are also possible. The figure shows a target 134, which upon being exposed to external voltage (for example, DC or RF) sputters particles of the target onto wires 132. Sputtering from target 134 may be in-axis as shown in the figure, or off-axis, with the targets lying in a plane perpendicular to the wires. The distance between the target and the wires (in the in-axis configuration) will optionally be 1 cm or larger, preferably not larger than the target diameter.

The figure further shows heaters 136, which are optionally quartz tubes with resistive spiral wires, the densities of which may be varied to adjust the temperature homogeneity, as discussed above.

FIG. 13B is a schematically illustrated side view of a system 139 for coating sapphire wires according to an exemplary embodiment. The figure shows furnace body 137, in which heaters 136 reside. Furnace body 137 preferably has low thermal conductivity and high electric resistance. Optionally, body 137 is made of alumina. FIG. 13B shows a system where the wires are coated from two sides, but other embodiments allow growing the layer from one side only.

FIG. 13B shows only one target at each side of the wire. In other embodiments, more targets are used along the wires. Generally, increasing the number of targets facilitates obtaining thicker layers in shorter deposition times. In some embodiments, up to 50% of the length of the wires is simultaneously exposed to sputtering from targets, while the rest is exposed to heating from both sides.

In some embodiments, targets will be placed facing each other such that the sputtering station will be free of any heaters, however, it will be preferable to place the targets such that the wire will be heated at least from one side when at a sputtering station.

In operation, wires 132 will be wound around spoolers 138' and 138" which will rotate in the same direction (clockwise in the drawings) to expose the wire continuously, and optionally at constant rate, to the sputtering targets (134). Optionally, all the wires will be wound around a single pair of spoolers; alternatively, several pairs of spoolers will be provided. In one embodiment, each wire will have its own pair of spoolers.

The diameter of the spoolers will be such that safe winding the sapphire wire around them will be allowed. In some embodiments, the diameter of each spooler is 12 inches (about 30 cm). The two spoolers are not necessarily of the same diameter. For example, if it is found that the coated wire is less flexible than the uncoated one, it may be desired to use a larger spooler for collecting the coated wire and a smaller spooler for feeding in the pristine wire.

In some embodiments, the position of the spoolers is vertically adjusted during coating, to ensure that the wires that go from one spooler to the other don't change angle in respect of the heaters, despite of the change occurring in the diameters of the two spoolers because one of them gives wire and the other collects.

In some embodiments, the spoolers will role intermittently, and the wires stay still, for example for several seconds or minutes, and move on. Continuous feeding, however, may result in more uniform coating layers.

In some embodiments, the wires are first coated with one coating (for example, YSZ), then it goes again through system 139, this time with different targets (for example YBCO) and/or different deposition atmosphere inside system 139, and or different heaters temperature. Optionally, the wires will go through the system more times, for example, once for coating the wires with YSZ, once with template layer of YBCO, and once with superconductive YBCO layer. Each such pass may require different targets and/or different atmosphere. Optionally, each such pass will be at a different rate. Optionally, a spooler that will be used as a collecting spooler in one pass will be used as a feed-in spooler in the next pass.

The rate at which the wires move in the apparatus will be set in accordance with the required thickness of the layer to be grown, and size of target that will be exposed to sputtering at one time. For example, if a 300 nm thickness is required, and the deposition rate is 0.03 nm/sec, each wire portion should be exposed to sputtering for 10,000 seconds (about 3 hours). If the distance between the spoolers and the number of the deposition stations along the wire will be such that 1 m of wire will be exposed to sputtering at any given time, the rate at which wire will be fed from one spooler to the other will be 1 meter per 10,000 seconds, or 100 micrometers/sec.

Substrate temperature, chemical composition of targets, and deposition atmosphere will be as described above.

It is expected that coating a wire depicted in FIG. 13C in the manner described herein will result in a wire having a cross-section as depicted in FIG. 13D.

FIG. 13C is a schematic perspective view of an r-cut sapphire wire before coating, obtainable in accordance with the teachings of Goyal.

FIG. 13D is a cross-section that the same wire is expected to have after it will be coated with YSZ and YBCO in accordance with an embodiment of the present invention. FIG. 13D is also schematic, and not in scale. The figure shows YSZ layer 135 and YBCO layer 137 coated on one side of the wire, and layers 135' and 137' on the other side. In embodiments where the two sides of the wire can be coated independently of each other, the thicknesses of the various layers, as well as their chemical compositions, may be different at the two sides of the wires. For example, a wire having the same thickness of YSZ on both sides, but different thicknesses of YBCO may be obtained by using a system as depicted in FIG. 13B, applying on both sides the same number of YSZ targets, but different numbers of YBCO targets.

Exemplary Applications

RF Antenna

Figure 11:
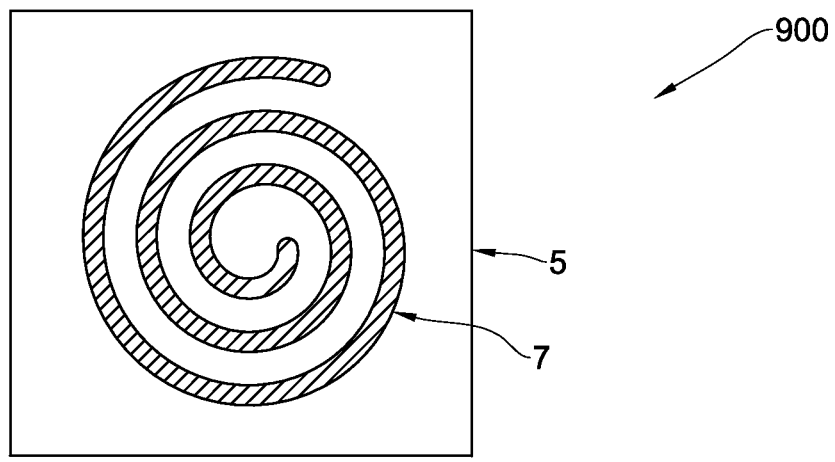
FIG. 11 is a schematic illustration an RF antenna according to an exemplary embodiment.

An YBCO layer according to an embodiment of the invention is optionally used as and RF antenna, that is, RF emitter, receiver, or transceiver. In one example, the RF antenna is of an MRI device. FIG. 11 is a schematic illustration of an RF antenna (900) according to an exemplary embodiment. The figure shows a substrate structure (5 in FIGS. 1A and 1B) including optionally an r-cut sapphire substrate having a surface area of between about 10 and 100 cm$^2$; and the above-described superconductive YBCO layered structure 7. Optionally, the layered structure 7 is formed in two stages: at first, the substrate structure 5 (e.g. the buffer YSZ layer) is coated with the YBCO layered structure as described herein, and then, a portion of the layered structure is removed, to provide a spiral shape pattern as shown. In other embodiments, the shape of the remaining layer is different, and is limited, if at all, by the ability to precisely remove portions of YBCO layer. Removal of a layer portion is optionally carried out using lithography, for example, light lithography, ion lithography, or e-beam lithography. Optionally, the applied lithographic technique uses dry etching; alternatively or additionally, the applied lithographic technique used wet etching, for example, with $H_3PO_4$.

The thickness of the superconductive layer in the layered structure 7 is preferably at least twice the penetration depth, which is the depth to which RF radiation to be emitted and/or received by the antenna penetrates into the layer. In one example, the penetration depth is 150 nm and the width of the superconductive YBCO layer is 300 nm or more, for example, 450 nm. Preferably, the protective layer (8 in FIG. 1) is YSZ, so as to make the antenna stronger than if other protective layer, such as $CeO_2$ is used.

Exemplary Fault Current Limiter

Figure 12:
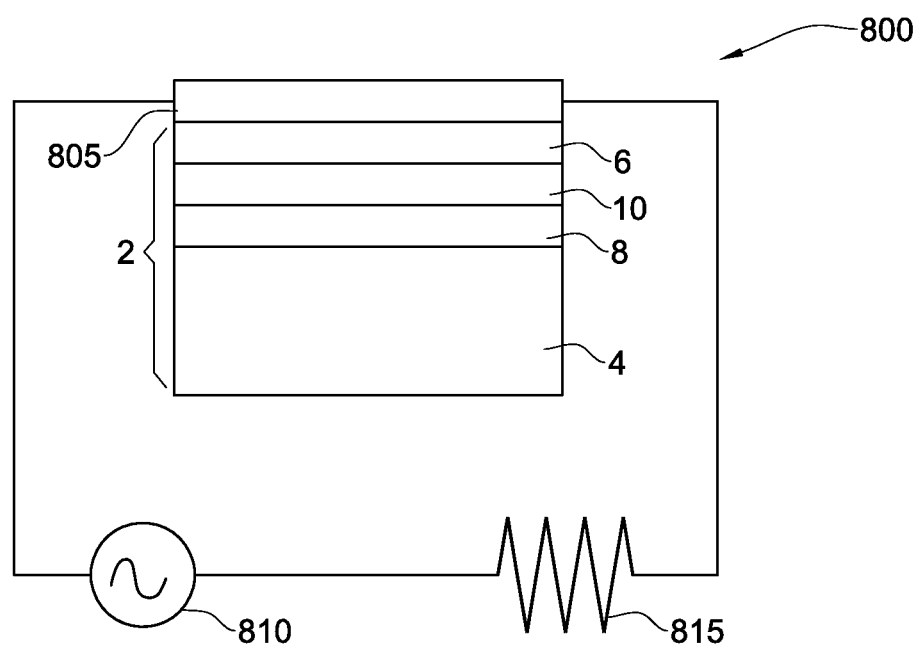
FIG. 12 is a schematic illustration of a Fault Current limiter (FCL) according to an embodiment of the invention.

FIG. 12 is a schematic illustration of a Fault Current limiter (FCL) according to an embodiment of the invention. FCL 800 comprises an article 2 as described in FIG. 1, and on the superconductive layer 6, a conducting (but not super conducting) layer 805, made of, for example, gold. Layer 805 optionally has thickness of 100-300 nm.

In the figure, FCL 800 is connected in series to an electrical circuit comprising a power source 810, and a power consumer 815. Power source 810 is optionally an AC source.

In operation, the current goes through layer 6 when it is below the critical current of the superconducting layer, and through the regularly conducting layer 805—otherwise.

The length of FCL 800 (see L in FIG. 1) is optionally 5 cm or more, such that the electrical resistance of layer 805 is sufficiently large not to short-circuit the electrical circuit, when the current in the circuit is above the critical current of layer 6.

Optionally, the superconductive layer 6 of FCL 800 is very thick, for example, 600 nm, 800 nm, 1000 nm, or more. Additionally or alternatively, the critical current is very high, for example, more than 100 A/cm width, optionally 200 A/cm width, or more.

It should be noted that although throughout this application various embodiments are described using a range format, whenever a numerical range is indicated herein, it is meant to include any cited numeral (fractional or integral) within the indicated range, including the two ends of the range. The phrases "between" a first indicate number and a second indicate number and "from" a first indicate number "to" a second indicate number are used herein interchangeably and are meant to include the first and second indicated numbers and all the fractional and integral numerals therebetween.

It is appreciated that certain features, which are, for clarity, described in the context of separate embodiments, may also be provided in combination in a single embodiment. Conversely, various features, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

The invention claimed is:

1. A superconductive layered structure for placing on a substrate structure, the superconductive layered structure comprising:
   a stack including at least one bi-layered assembly formed by first and second layers of similar superconducting material compositions, the second layer being superconductive at predetermined temperature condition, the first layer being a substantially thin layer and having a c lattice parameter selected in accordance with those of the substrate structure and the second layer, such that said first layer is non-superconductive at said predetermined temperature condition thereby allowing the second superconductive layer to be desirably thick to provide high critical current density of the superconductive layer.

2. A superconductive layered structure according to claim 1, wherein the bi-layered assembly comprises the first non-superconductive layer of a compound of the formula $YBa_2Cu_3O_{7-x}$ (YBCO), and the second superconductive layer of YBCO on top thereof, the first YBCO layer serving as a template layer to provide a desired relation between c lattice parameters and thicknesses of the first layer of YBCO and the second layer of YBCO.

3. A superconductive layered structure according to claim 2, wherein the first template layer has a thickness substantially not exceeding 50 nm and has the c lattice parameter of at least 1.175 nm being therefore non-superconductive at temperature above at least 77K, and the second superconductive layer of YBCO has a thickness of at least 300 nm and has the c lattice parameter of between 1.1169 and 1.171 nm.

4. A superconductive layered structure according to claim 2, wherein said second layer of YBCO has surface area between 10 cm$^2$ and 100 cm$^2$.

5. A superconductive layered structure according to claim 2, wherein said second layer of YBCO has thickness of between 10 nm and 50 nm.

6. A superconductive layered structure according to claim 2, wherein said second layer of YBCO has thickness of between 600 nm and 1500 nm.

7. A superconductive layered structure according to claim 1, comprising at least two of the bi-layered assemblies located one on top of the other, such that the first layer of a successive bi-layered assembly is located on the second layer of a preceding bi-layered assembly.

8. An article comprising a substrate structure, and the superconductive layered structure of claim 1 on at least a part of a surface of the substrate structure.

9. An article according to claim 8, wherein the substrate structure comprises a single crystal sapphire substrate.

10. An article according to claim 8, wherein said superconductive layered structure is located on at least two opposite surface portions of the substrate structure.

11. An article according to claim 8, wherein said superconductive layered structure is formed as a coating on the entire surface of the substrate structure.

12. An article comprising a substrate structure, and the superconductive layered structure of claim 2 on at least a part of a surface of the substrate structure.

13. An article according to claim 12, wherein the substrate structure comprises a single crystal sapphire substrate.

14. An article according to claim 12, wherein said superconductive layered structure is located on at least two opposite surface portions of the substrate structure.

15. An article according to claim 12, wherein said superconductive layered structure is formed as a coating on the entire surface of the substrate structure.

16. An article according to claim 12, wherein the substrate structure comprises a substrate carrying a buffer layer of YSZ material.

17. An article according to claim 8, wherein the surface of the substrate structure carrying said superconductive structure is substantially planar.

18. An article according to claim 12, wherein the surface of the substrate structure carrying said superconductive structure is substantially planar.

19. An article according to claim 8, configured and operable as an RF antenna, said superconductive layered structure having a spiral like pattern.

20. An article comprising:
   a substrate structure comprising a single crystal r-cut sapphire substrate defining two opposite surfaces, and an YSZ layer on each of said two opposite surfaces; and
   a superconductive layered structure on each of the YSZ layers, the superconductive layered structure comprising at least one bi-layered assembly formed by a first layer of YBCO on the YSZ layer, and a second superconductive layer of YBCO on the first YBCO layer, wherein the first layer of YBCO serves as a template layer for the second YBCO layer to provide desired relations between c lattice parameters and thicknesses of the first layer of YBCO and the second layer of YBCO, enabling the second superconductive layer of YBCO to be desirably thick thereby providing high critical current density of the superconductive layer, the first template layer having a thickness substantially not exceeding 50 nm and having the c lattice parameter of at least 1.175 nm being therefore non-superconductive at temperature above at least 77K, and the second superconductive layer of YBCO having a thickness of at least 300 nm and having the c lattice parameter of between 1.1169 and 1.171 nm.

21. An article according to claim 12, manufactured by a method comprising
   (a) providing the substrate structure formed by a substrate having a surface with at least a portion thereof covered with an YSZ layer;
   (b) depositing YBCO onto the YSZ layer so as to form the first template layer of a predetermined, relatively small, thickness and having a c lattice parameter of at least 1.175 nm, thereby providing the non-superconductive YBCO layer; and
   (c) depositing YBCO onto the first template layer so as to form an YBCO layer of a predetermined, relatively large, thickness having a c lattice parameter of between 1.1169 and 1.171 nm, thereby forming said superconductive YBCO layer.

22. An article according to claim 21, wherein said method comprises stopping the deposition of the first YBCO layer when the thickness of the layer being deposited is between 10 nm and 50 nm.

23. An article according to claim 21, wherein said method comprises stopping the deposition of the second YBCO when the thickness of the layer being deposited is 600 nm or more.

24. An article according to claim 21, wherein said providing the substrate structure comprises:
   sputtering YSZ on the substrate under an atmosphere consisting essentially of oxygen.

25. An article according to claim 24, wherein sputtering is carried out at a substrate temperature of between 890° C. and 930° C.

26. An article according to claim 25, comprising radiating the substrate so as to heat it to a predetermined temperature.

27. A method of manufacturing the article of claim 12, the method comprising:
   (a) providing the substrate structure formed by a substrate having a surface with at least a portion thereof covered with an YSZ layer;
   (b) depositing YBCO onto the YSZ layer so as to form the first template layer of a predetermined, relatively small, thickness and having a $c$ lattice parameter of at least 1.175nm, thereby providing the non-superconductive YBCO layer; and
   (c) depositing YBCO onto the first template layer so as to form an YBCO layer of a predetermined, relatively large, thickness having a c lattice parameter of between 1.1169 and 1.171nm, thereby forming said superconductive YBCO layer.

28. A method according to claim 27, comprising stopping the deposition of the first YBCO layer when the thickness of the layer being deposited is between l0nm and 50nm.

29. A method according to claim 27, comprising stopping the deposition of the second YBCO when the thickness of the layer being deposited is 600nm or more.

30. A method according to claim 27, wherein providing the substrate structure comprises:
   sputtering YSZ on the substrate under an atmosphere consisting essentially of oxygen.

31. A method according to claim 30, wherein sputtering is at a substrate temperature of between 890° C. and 930° C.

32. A method according to claim 31, comprising radiating the substrate so as to heat it to a predetermined temperature.

* * * * *